United States Patent [19]

Scudder et al.

[11] Patent Number: 5,298,107
[45] Date of Patent: Mar. 29, 1994

[54] PROCESSING METHOD FOR GROWING THICK FILMS

[75] Inventors: Lance A. Scudder, Mountain View; Norma Riley, Pleasanton; Jon M. Schalla, San Jose, all of Calif.

[73] Assignee: Applied Materials, Inc., Santa Clara, Calif.

[21] Appl. No.: 843,987

[22] Filed: Feb. 27, 1992

[51] Int. Cl.$^5$ .............................................. C30B 25/12
[52] U.S. Cl. .................... 156/610; 156/612; 118/730
[58] Field of Search .................. 156/610, 612; 118/730

[56] References Cited

U.S. PATENT DOCUMENTS

| | | | |
|---|---|---|---|
| 4,579,080 | 4/1986 | Martin et al. | 118/730 |
| 4,630,058 | 12/1986 | Dixon et al. | 118/730 |
| 4,705,700 | 11/1987 | Ikeda et al. | 118/730 |
| 5,070,813 | 12/1991 | Sakai et al. | 118/730 |

Primary Examiner—Robert Kunemund
Attorney, Agent, or Firm—Noel F. Heal

[57] ABSTRACT

A technique for impeding the formation of mechanical bonds between workpieces, such as semiconductor wafers, and a carrier or susceptor on which they are supported during a deposition or layer formation process, such as in epitaxial processing. In the formation of relatively thick films, greater than approximately 50 microns (50 μm) thick, wafers can become mechanically bonded to the susceptor on which they are supported, and are subject to damage caused by thermal stresses during a cooldown phase of processing. In the disclosed method, the speed or direction of rotation of a rotatable susceptor is abruptly changed at least once, or periodically during processing. Slight movement of the wafers with respect to the susceptor during each rotation speed change or reversal tends to break any bonds before they can develop strength, and production yields of acceptable wafers are significantly improved.

6 Claims, 1 Drawing Sheet

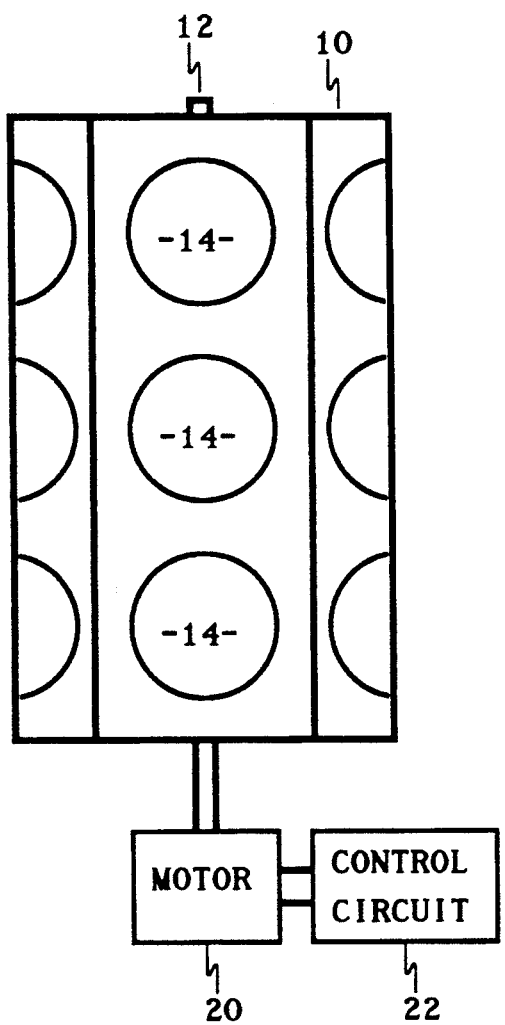
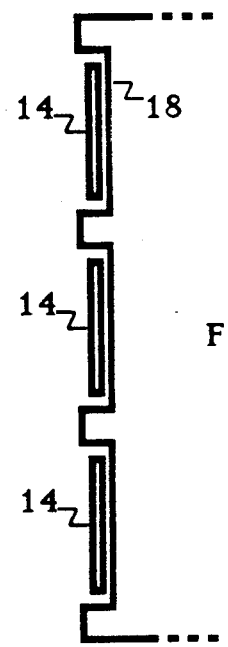
FIG. 2
FIG. 1

PROCESSING METHOD FOR GROWING THICK FILMS

BACKGROUND OF THE INVENTION

This invention relates generally to epitaxial growth in semiconductor fabrication processes and, more particularly, to the fabrication of thick films, greater than approximately 50 microns (50 μm) thick. Probably the most significant problem in very thick film growth is stress-induced breakage of semiconductor wafers being processed. It is with this problem that the present invention is concerned.

In epitaxial processing, layers of various materials, usually silicon-based, are grown by a deposition process in a processing chamber. Typically, semiconductor silicon wafers are first loaded onto the outer surfaces of a silicon carbide coated graphite support, called a susceptor. The susceptor has multiple flat external surfaces to accommodate a number of large wafers, and the entire susceptor is lowered into a quartz processing jar, into which appropriate gases are admitted to effect formation of a layer of material on the silicon wafers. To ensure uniformity of deposition of the film, the susceptor is rotated at a uniform speed, about its vertical axis. Without the rotation, the thickness profile would tend to vary depending on a number of factors, such as the relative location of processing gas inlet ports.

After an appropriate time, the susceptor rotation is stopped, the susceptor and wafers are cooled down, the susceptor is lifted from the quartz jar, and the wafers are removed from the susceptor. For films in excess of 50 microns (50 μm), cooldown often results in bending and breakage, sometimes referred to as microcracking, of some of the wafers. Prior to this invention, there has been no effective technique for minimizing or eliminating this wafer damage problem.

SUMMARY OF THE INVENTION

The present invention resulted from an observation that, during processing, growth occurs over not just the wafers, but also over the exposed surfaces of the susceptor, and bonds may develop between the wafer edges and their closest points of contact with the susceptor. During cooldown, thermal stresses often result in bending or breaking of some of the wafers, and this breakage has been traced to the existence of "pinning sites" between the wafers and the susceptor.

The present invention resides in a method for impeding the formation of mechanically strong bonds between workpieces, such as wafers, subject to a thick film process, and a carrier or susceptor on which the workpieces are supported during the process. Briefly, and in general terms, the method of the invention comprises the steps of placing one or more workpieces on a rotatable carrier, placing the carrier and the workpieces in a processing environment, initiating a process wherein material is deposited on the workpieces in the processing environment, rotating the carrier, for uniformity of processing, and abruptly changing the speed or direction of rotation of the carrier at least once, to break any bonds that have formed between the workpieces and the carrier.

The method may further include cooling the carrier and the workpieces, wherein any remaining bonds between the workpieces and the carrier are broken as a result of thermal stresses, and removing the carrier and the workpieces from the processing environment at the end of processing, but with greatly reduced risk of damage to the workpieces.

In the presently preferred embodiment of the invention, the step of abruptly changing the speed or direction of rotation is effected by abruptly reversing the direction of rotation.

It will be appreciated from the foregoing summary that the present invention is a significant improvement over conventional epitaxial processing. Reversal of the direction of rotation of the susceptor at least once, or periodically if longer processing is involved, impedes the formation of microbridges between the susceptor and the wafers, and improves the production yield of acceptable wafers. Other aspects and advantages of the invention will become apparent from the following more detailed description, taken in conjunction with the accompanying drawings.

BRIEF DESCRIPTION OF THE DRAWINGS

FIG. 1 is a diagrammatic view of a wafer susceptor used in thick film processing; and FIG. 2 is a fragmentary cross-sectional view of a wafer positioned on the wafer susceptor.

DESCRIPTION OF THE PREFERRED EMBODIMENT

As shown in the drawings for purposes of illustration, the present invention is concerned with an improvement in epitaxial or similar processes for forming thick films in semiconductor processing. A significant problem arises when forming thick films, over approximately 50 microns (50 μm) in thickness. Semiconductor wafers or other workpieces must be carried into a processing chamber on a susceptor of some type, usually a vertical barrel, which is lowered into the processing chamber and slowly rotated, typically at approximately 2-10 rpm, during formation of the desired film, to ensure uniform deposition. Unfortunately, bonds or microbridges form between the wafers and surfaces of the susceptor is subjector. When the desired film has been formed, the susceptor is subjected to a cooldown phase of processing, prior to removal from the processing chamber. During the cooldown phase, thermal stresses can cause unwanted bending and cracking of the wafers. For thinner films, the microbridges are mechanically weak and break during cooldown, leaving the wafers undamaged.

In accordance with the invention, the speed or direction of rotation of the susceptor is abruptly changed at least once during film formation. Small mechanical stresses imposed on the wafers by the abrupt changes in speed or direction of rotation are sufficient to break any bonds that have formed between the wafers and the susceptor. Any bonds that remain at the conclusion of the process are mechanically weak and will break as a result of thermal stresses during the cooldown phase.

FIG. 1 depicts a susceptor of the vertical barrel type, indicated by reference numeral 10, mounted for rotation about a vertical axis 12. The susceptor 10 carries multiple wafers or other workpieces, three of which are indicated at 14. The wafers 14 are supported on flat near-vertical side faces of the susceptor 10, as indicated in principle in FIG. 2. Each wafer 14 is carried in a "pocket" on the susceptor 10. Each near-vertical side face of the susceptor, such as the one indicated at 18, is sloped at approximately 2°-3° to true vertical, such that each wafer 14 will rest against the surface without clamping.

The susceptor 10 is driven by a reversible motor 20, under control of a control circuit 22. At the start of processing, the control circuit rotates the susceptor motor in a first direction for some preselected time interval, and then reverses the direction of rotation periodically, such as every five to ten minutes. At each rotation reversal, the wafers 14 move slightly within the susceptor pockets, and microbridges that have formed are broken before they can become mechanically strong. Any bonds that remain at the end of processing are weak enough to be broken easily by thermal stressing during cooldown, with greatly reduced risk of damage to the wafers. Accordingly, production yields of acceptable wafers are significantly improved over the yields obtained without reversing the direction of rotation.

It will be appreciated from the foregoing that the present invention represents a significant improvement in thick film processing. In particular, the invention impedes the formation of bonds or microbridges between wafers being processed and the susceptor on which they are carried. The invention has application in various environments in which thick layers of material are formed over a workpiece supported on a carrier, such as a susceptor. The process involved may involve any of a variety of mechanisms, such as epitaxial layer deposition, formation of a polysilicon layer, or formation of a metallization layer. It will also be appreciated that, although a specific embodiment of the invention has been described for purposes of illustration, various modifications may be made without departing from the spirit and scope of the invention. Accordingly, the invention is not to be limited except as by the appended claims.

We claim:

1. A method for impeding the formation of bonds between workpieces and a carrier on which the workpieces are supported for a thick film deposition process, the method comprising the steps of:

placing one or more workpieces on a rotatable carrier;

placing the carrier and the workpieces in a processing environment;

initiating a process wherein a thick film of material is deposited on the workpieces in the processing environment;

continuing the deposition process for a total time long enough to result in the formation of bonds between the wafers and the susceptor;

rotating the carrier, for uniformity of processing; and abruptly changing the speed or direction of rotation of the carrier at least once during processing, to cause the workpieces to move momentarily with respect to the carrier, thereby breaking any of said bonds that have formed between the workpieces and the carrier, and preventing any strong bonds from forming.

2. A method as defined in claim 1, and further comprising:

cooling the carrier and the workpieces, wherein any remaining bonds between the workpieces and the carrier are broken as a result of thermal stresses, but with greatly reduced risk of damage to the workpieces; and removing the carrier and the workpieces from the processing environment at the end of processing.

3. A method for inhibiting the formation of bonds between semiconductor wafers in a thick film deposition process, and a susceptor on which the wafers are supported, comprising the steps of:

placing one or more wafers on a rotatable susceptor;

placing the susceptor and the wafers in a processing chamber;

initiating a process wherein a thick film of material is deposited on the wafers in the processing chamber, and is incidentally deposited on exposed surfaces of the susceptor;

continuing the deposition process for a total time long enough to result in the formation of bonds between the wafers and the susceptor;

rotating the susceptor, for uniformity of processing; and abruptly changing the speed or direction of rotation of the susceptor at least once during processing, to cause the wafers to move momentarily with respect to the susceptor, to break any of said bonds that have formed between the wafers and the susceptor.

4. A method as defined in claim 3, and further comprising:

cooling the susceptor and the wafers, wherein any remaining bonds between the wafers and the susceptor are broken as a result of thermal stresses, but with greatly reduced risk of damage to the wafers; and removing the susceptor and the wafers from the processing chamber at the end of processing.

5. A method as defined in claim 3, wherein the step of abruptly changing is effected by reversing the direction of rotation.

6. A method as defined in claim 5, wherein the step of reversing the direction of rotation is performed periodically.

* * * * *